(12) United States Patent
Mangan et al.

(10) Patent No.: US 7,970,577 B2
(45) Date of Patent: Jun. 28, 2011

(54) METHOD AND SYSTEM FOR EVALUATING AN OBJECT THAT HAS A REPETITIVE PATTERN

(75) Inventors: Shmuel Mangan, Rehovot (IL); Michael Ben-Yishai, Natanya (IL); Lior Shoval, Bnei Darom (IL)

(73) Assignee: Applied Materials Israel, Ltd., Rehovot (IL)

( * ) Notice: Subject to any disclaimer, the term of this patent is extended or adjusted under 35 U.S.C. 154(b) by 331 days.

(21) Appl. No.: 12/266,486

(22) Filed: Nov. 6, 2008

(65) Prior Publication Data
US 2009/0240466 A1 Sep. 24, 2009

Related U.S. Application Data

(63) Continuation of application No. 12/137,097, filed on Jun. 11, 2008, now abandoned.

(60) Provisional application No. 60/943,243, filed on Jun. 11, 2007.

(51) Int. Cl.
*G01B 11/00* (2006.01)
*G01B 11/02* (2006.01)
*G03B 27/42* (2006.01)

(52) U.S. Cl. ............... 702/158; 356/388; 355/53
(58) Field of Classification Search .......... 702/158, 702/182; 356/388, 500; 355/53, 55; 430/5, 430/30
See application file for complete search history.

(56) References Cited

U.S. PATENT DOCUMENTS 6,924,896 B2 * 8/2005 Hill .......................... 356/500
7,262,831 B2 * 8/2007 Akhssay et al. ............ 355/52

* cited by examiner

*Primary Examiner* — Bryan Bui
(74) *Attorney, Agent, or Firm* — SNR Denton US LLP

(57) ABSTRACT

A method for evaluating placement errors within a lithographic mask, the method includes: providing or receiving a reference result that represents a distance between a reference pair of points of a reference element; measuring, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determining relative placement errors in response to relationships between the reference result and each of the measurement results.

61 Claims, 7 Drawing Sheets

| 310 determining a first set of relative placement errors of a first lithographic mask is that is used during a first manufacturing stage of a product |
|---|

| 320 determining a second set of relative placement errors of a second lithographic mask that is used during a second manufacturing stage that follows the first manufacturing stage |
|---|

| 330 determining expected overlay errors by comparing the first and second sets of the relative placement errors |
|---|

| 340 compensating for the expected overlay errors |
|---|

METHOD AND SYSTEM FOR EVALUATING AN OBJECT THAT HAS A REPETITIVE PATTERN

RELATED APPLICATIONS

This application is a CONTINUATION of U.S. application Ser. No. 12/137,097 filed Jun. 11, 2008 which is a NONPROVISIONAL of, claims priority to and incorporates by reference U.S. Provisional Patent Application No. 60/943,243, filed Jun. 11, 2007.

FIELD OF THE INVENTION

This invention is generally in the field of automatic optical inspection of objects such as masks or wafers that include a repetitive pattern.

BACKGROUND

As lithography technology is improving and features get smaller and smaller, further improvements in precision, resolution and accuracy are required. It is important to realize that the CD budget can no longer be treated as a separated control measure. For example, in the sub 45 nm nodes, using the Double Patterning Technology (DPT), overlay errors become part of the overall CD budget.

As the placement error is one of the errors which have impact on the CD, it is important to be able to measure the placement error at the feature resolution level. Since some of the CD budget is due to the mask, it is important to be able to measure the placement error between different locations on the mask (or between masks).

SUMMARY OF THE INVENTION

A method for evaluating placement errors within a lithographic mask, the method includes: providing or receiving a reference result that represents a distance between a reference pair of points of a reference element; measuring, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determining relative placement errors in response to relationships between the reference result and each of the measurement results.

A computer program product that comprises a computer readable medium that stores instructions for: providing or receiving a reference result that represents a distance between a reference pair of points of a reference element; measuring, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determining relative placement errors in response to relationships between the reference result and each of the measurement results.

A system for evaluating a placement error, the system comprises a memory unit and a processor; wherein the memory unit stores a reference result that represents a distance between a reference pair of points of a reference element; and wherein the processor is adapted to: measure, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determine relative placement errors in response to relationships between the reference result and each of the measurement results.

BRIEF DESCRIPTION OF THE DRAWINGS

In order to understand the invention and to see how it may be carried out in practice, an embodiment will now be described, by way of non-limiting example only, with reference to the accompanying drawings, in which:

FIG. 6 is a flow chart of a method for determining expected overlay errors according to an embodiment of the invention.

DETAILED DESCRIPTION

Figure 1:
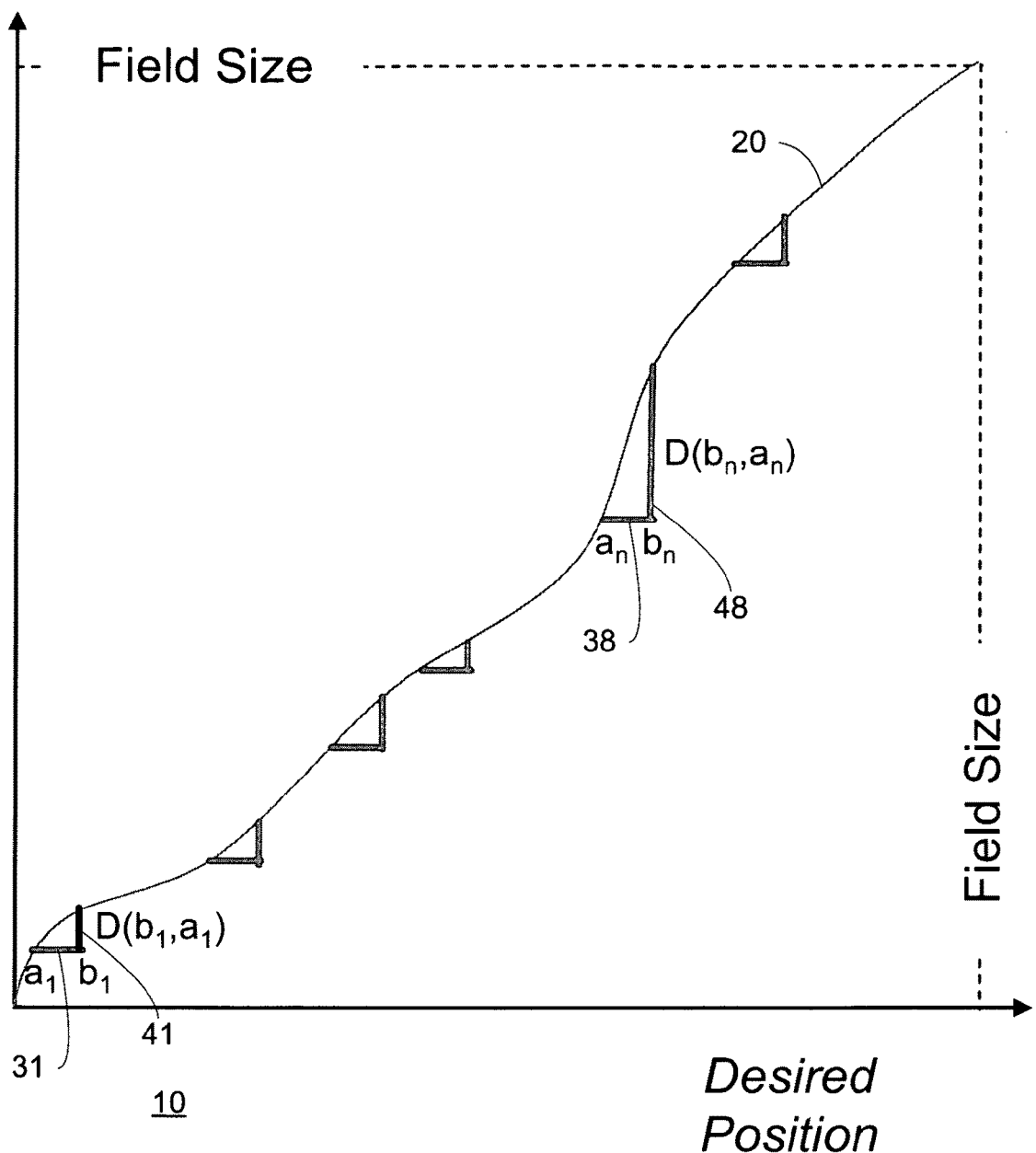
FIG. 1 illustrates a map of a lithographic mask according to an embodiment of an invention.

A method, system and computer program product are provided. Differences between distances between a reference pair of points and between each pair of points associated with different elements of a lithographic mask are calculated and are used to determine relative placement errors.

The relative placement errors can be calculated after performing a global alignment process and a dice (or a more localized) alignment process. While the global alignment process and the more localized alignment process can depend upon dedicated alignment targets the relative placement errors can be determined without such dedicated alignment targets.

These relative placement errors represent a deviation of the lithographic mask from an ideal mask.

By comparing relative placement of different lithographic masks that are applied one after the other overlay errors can be detected and can optionally be compensated. Thus, when applying a double patterning process overlay errors can be calculated in advance and compensated by a feed forward process.

The method, system and computer program product can provide a map and even a dense map of relative placement errors over one or more portions of the lithographic mask (also referred to as reticle) and even over the entire mask.

The relative placement errors can be provided to mask manufacturing process that can try to produce another mask in which the relative placement errors are smaller.

It is noted that the system can optically acquire images of the lithographic mask but can also be a system that can not optically acquire such images.

It is noted that relative placement errors of multiple masks can be generated and then provided to a mask manufacturing process or to a lithographic process (that utilizes a lithographic mask).

The relative replacement errors are responsive to a reference result. The reference result can be obtained from a data base, from another lithographic mask, from multiple other lithographic masks, or from another portion of the evaluated lithographic mask.

The reference result and, additionally or alternatively, measurement results can be obtained by using one or more inspection tools.

The system, method and computer program product can be applied mutatis mutandis on wafers, set of wafers, sets of lithographic masks.

The below explanations are described for lithographic masks, but can be used also for wafers, mask layout from databases, or for any combination of masks, layouts and wafers.

Measuring Placement Error by a Method of Relative Distances

In order to perform placement error measurements along and within the entire mask using an inspection machine, some reference points/locations/features should be selected. Then, the reference feature is measured (for example—a length of the reference feature from its beginning till its end or a length of a few periods of periodical sub elements of the reference element) and repeat this measurement on same features (measured features) along the entire mask or along one or more predefined portions of the mask. Comparing a difference (relative distance) between a measured element (feature) and the reference element can provide a relative placement error. A map of relative placement error can be built in response to relative placement errors associated with elements located in different locations over the mask.

FIG. 1 illustrates map 10 of relative placement errors according to an embodiment of the invention.

Map 10 includes curve 20 that represents the relationships between a reference result and measured results.

The slope of curve 20 at each point represents the ratio between the reference result and a measurement result of a measured element that is associated with that point. The associated can be determined based upon the location of the measured element, bus this is not necessarily so.

Curve 20 can be a polynomial (and especially a low order polynomial) that approximates the relationship between the reference result (such as horizontal line a1, b1 31) and the measured result (such as D(a1, b1) 41). FIG. 1 also illustrates additional reference results such as (an, bn) 38 and additional measured results such as D(an, bn) 48.

It is noted that multiple reference results can be provided. In this case one or more measured results can be compared to each reference result. A reference result should have been equal to a measured result is placement errors did not exist.

According to one embodiment of the invention relative placement errors are calculated by relative gradients. This includes: (i) finding a map of variation of derivatives; (ii) applying a normalization process; and (iii) reconstructing the placement variation map. The placement variation map can be reconstructed based upon knowledge of the scaling and the fact that the placement variations are small. The map can represent variations of the derivatives over the entire lithographical mask or selected portions.

The derivatives are measured by the following process: (i) finding in each frame (in each Field of View—FOV) two distant features (that provide two points), measure the distance between them (between the pair of points), and either divide the measured distance (also referred to as measurement result) by a reference result or subtract the measurement result by the reference result (which can be the expected distance between the two points). The reference result can be taken from a reference image which contains the same points, from a database, from another mask, or from a wafer. The reference result can also be the distance between multiple sub elements of a repetitive array of sub elements (it can be represented by the number of periods—the number of sub elements).

It is noted that the reference element can differ from a measured element (even is no replacement error exists) but the reference result should equal the measurement result in the absence of placement errors. Alternatively, a fixed relationship (for example a scaling ratio) can be expected to be maintained between the reference result and a measurement result at the absence of replacement errors.

Conveniently, the mentioned above method can be applied for measuring placement errors and even overlay errors when multiple evaluated masks are used to manufacture a certain product. The masks can be used to manufacture the same layer or different layers. Two masks are used to manufacture the same layer of the product in a double patterning process during which a highly dense pattern is manufactured by masks that when illuminated generate less dense patterns.

Figure 2:
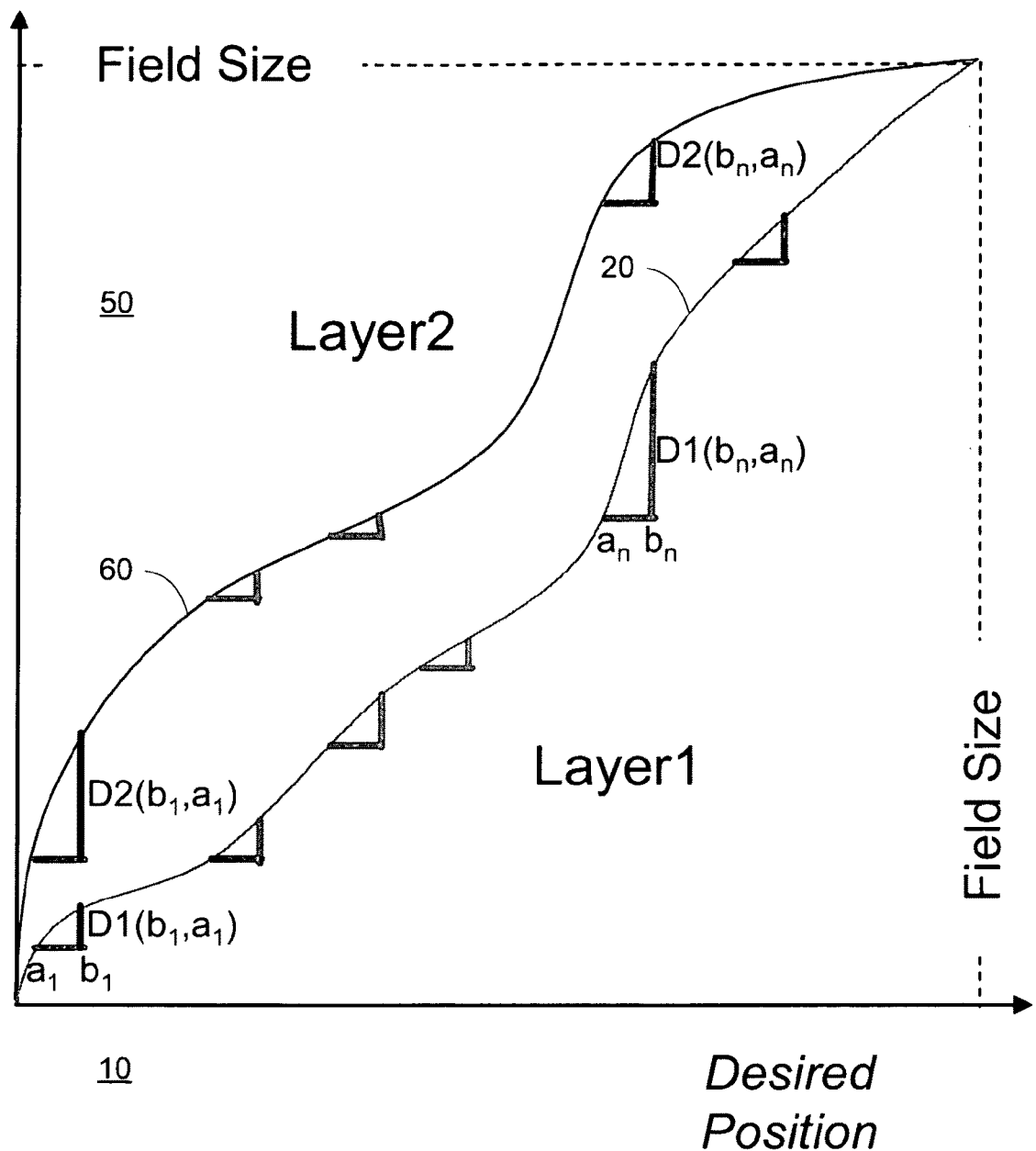
FIG. 2 illustrates two maps of two lithographic masks according to an embodiment of an invention.

The relative placement errors of one mask can be compared to the relative placement errors of another mask in order to determine expected overlay errors. The map of each mask can be compared to a map of another mask, as illustrated in FIG. 2.

Map 10 of first mask includes curve 20 that represents the relationships between a reference result and measured results of the first mask. Map 50 of second mask includes curve 60 that represents the relationships between a reference result and measured results of the second mask.

Figure 3:
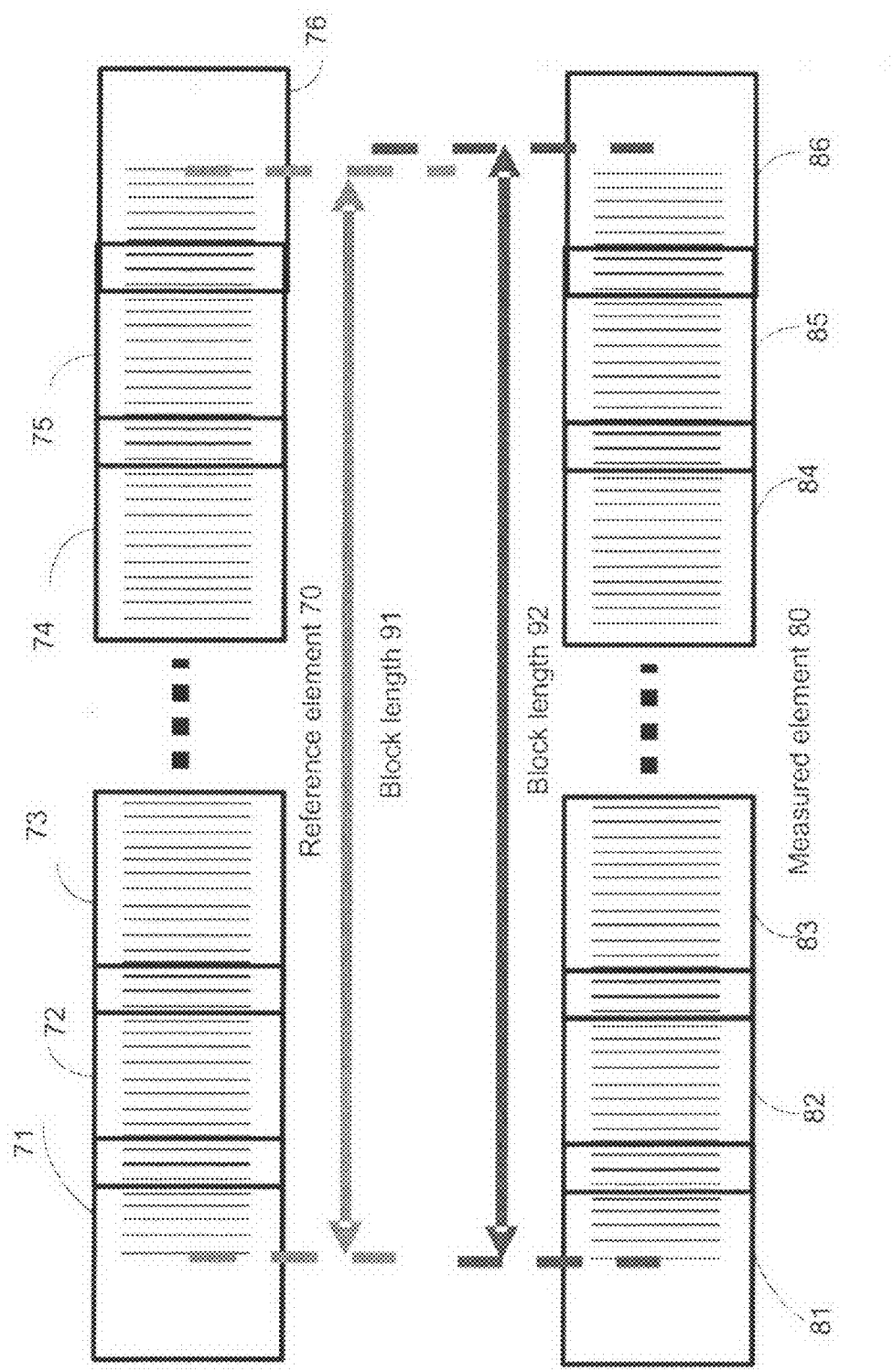
FIG. 3 illustrates multiple overlapping images of one or more repetitive arrays of sub elements.

The distance between a pair of points or the difference between the distances between a pair measured points and the pair of reference points can be measured in various manners. According to an embodiment of the invention an overlapping algorithm is provided. The overlapping algorithm includes obtaining multiple partially overlapping images of the mask. Such overlapping images are illustrated in FIG. 3. For example overlapping frames 71-76 of a reference element and overlapping images 81-86 of a measured element. An overlap area that is shared between two adjacent frames (images) can be used to align a second image very accurately to the first image that is adjacent to the second image.

This alignment process can be repeated as many times as needed so as to form a chain of frames with a very accurate alignment.

The overlapping algorithm can be applied to all masks with a periodic pattern, but can be also implemented on non-periodical manners.

According to another embodiment of the invention a cycle modulo algorithm is provided. It can solve ambiguity problems resulting from alignment of images of periodical patterns. This is especially true when the measured distance between two points include multiple repetitions of the pattern. In this case only sub-period differences are taken into account and distance changes that are equal to one or more periods of the periodical pattern are ignored of.

For example, if the period is 30 nanometer, a 30 nanometer modulo operation is applied. Thus, if the distance between a pair of reference points equals N1 periods and a distance between a pair of measured points equals N2 elements and a sub period distance d then although the distance difference is (N2−N1)*30 nanoMeters+d, only d is taken into account.

The difference between N1 and N2 can result from alignments of overlapping images of the measured element that can miss a period or can skip a period. Such differences can be illustrated in FIG. 3. In FIG. 3 block length 91 of reference 70 element is compared to block length 92 of measured element 80. The difference can be offset, due to placement errors by less that a period of the periodic pattern that forms the reference element and the measured element.

The alignment process of each pair of adjacent images can be done very accurately by phase matching on the periodic pattern (shared areas on both frames).

According to an embodiment of the invention the distance between a pair of points of a measured element can be accurately measured by a alignment process in which one point is aligned to a corresponding reference point and the difference between the second measured point and the other reference point is also measured. The difference between the location of the second reference point and second measured point is indicative of the difference between the reference distance and the distance between the measured points.

Figure 4:
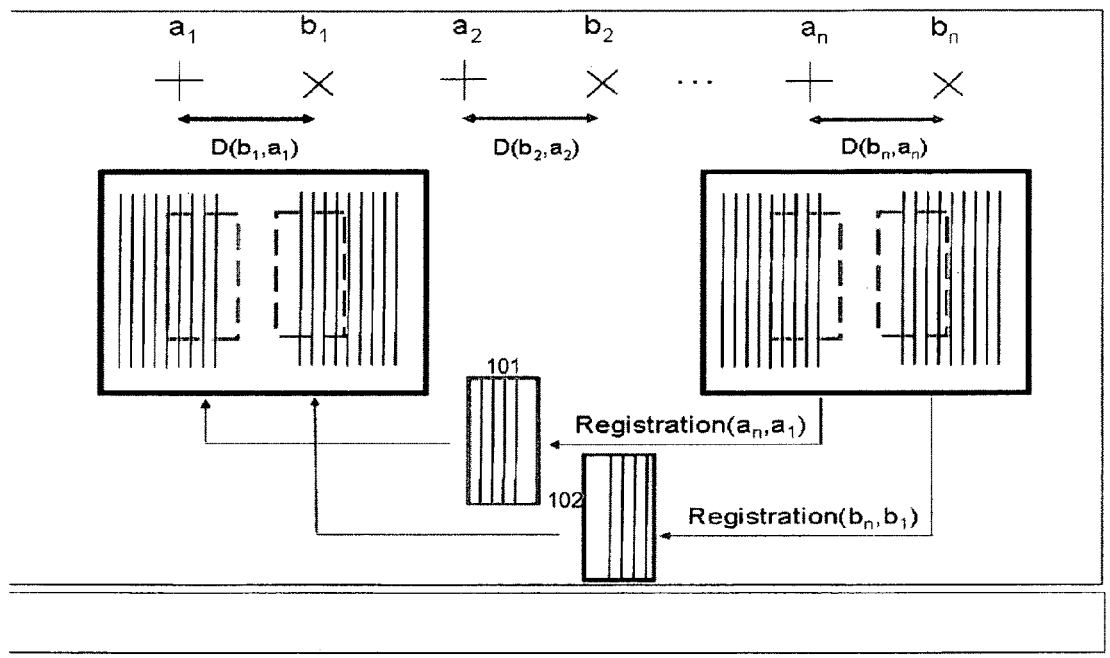
FIG. 4 illustrates a registration process between two sub images, according to an embodiment of the invention.

The registration process can include cut out both features with their close surrounding—obtaining images of each points and its surroundings and obtaining images of each reference point and its surroundings. Such a process is illustrated in FIG. 4 where two sub images (101 and 102) of two points and their vicinity are processed by comparing them to corresponding sub images of reference elements.

According to an embodiment of the invention a low order polynomial can be calculated in order to approximate the relationships between the reference result and each of the measurement results.

The low order polynomial can be used as the placement error phenomena is basically a slow variant phenomena. The order of the polynomial can be determined by the sampling rate of the placement error and placement error variability. The more samples are there, the higher order polynomial can be used. In fact a more complex fitting can be used like the cubic spline. In the regions where there exist many samples, the effective polynomial order can be is higher.

Figure 5:
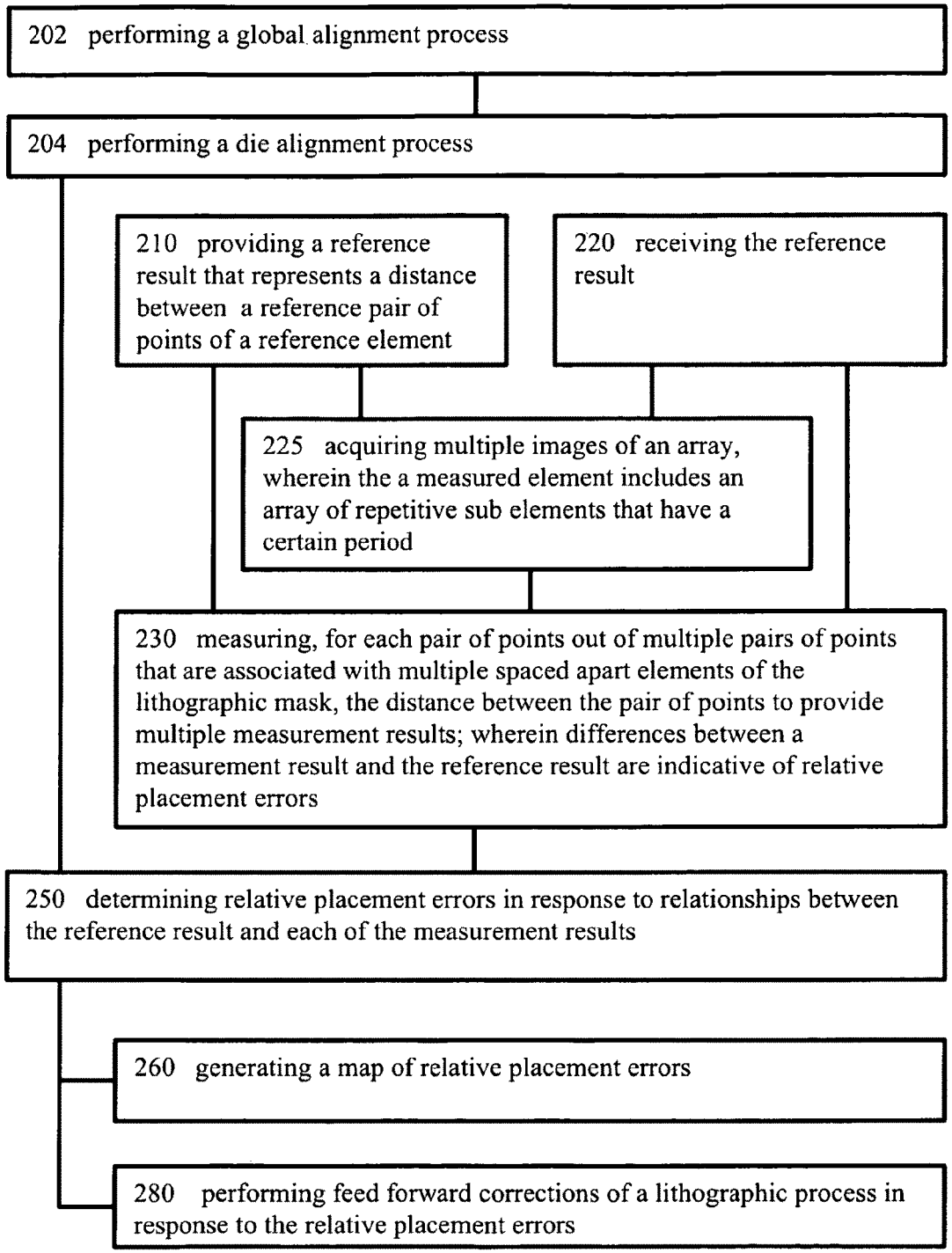
FIG. 5 is a flow chart of a method for determining placement errors according to an embodiment of the invention.

FIG. 5 illustrates method 200 according to an embodiment of the invention.

Method 200 starts by either one of stages 210 and 220. Stage 210 includes providing a reference result that represents a distance between a reference pair of points of a reference element. Stage 220 includes receiving the reference result.

Stage 210 and 220 are followed by stage 230 of measuring, for each pair of points out of multiple pairs of points that are associated with multiple spaced apart elements of the lithographic mask, the distance between the pair of points to provide multiple measurement results; wherein differences between a measurement result and the reference result are indicative of relative placement errors.

Stage 230 includes performing multiple measurements of distances between multiple pair of points. These pair of points can belong to measured elements that are spread over the entire mask or over selected portions of the mask.

Conveniently, stage 230 includes measuring a difference between a distance between a pair of points of an element and the distance between the reference pair of points of the reference element by aligning the element to the reference element.

Stage 230 is followed by stage 250 of determining relative placement errors in response to relationships between the reference result and each of the measurement results.

Conveniently, stage 250 includes determining relative placement errors in response to differences between the reference result and each of the measurement results.

Conveniently, stage 250 includes determining relative placement errors in response to differences between ratios between each measurement result and the reference result.

Stage 250 can be followed by stage 260 of generating a map of relative placement errors. The map can be dense—thus it can include multiple relative placement errors of elements that are relatively close to each other.

An element can include multiple repetitive sub-elements that form an array.

It is noted that the reference element can differ from a measured element.

Conveniently a measured element includes an array of repetitive sub elements that have a certain period and stages 210 and 220 are followed by stage 225 of acquiring multiple images of the array. Stage 225 is followed by stage 230 that includes aligning different images of the array. Stage 230 is followed by stage 250 of determining at least one relative placement error in response to a sub period difference between the reference result and a measurement result. Stage 250 can include applying a period module operation on a difference between the reference result and a measurement result.

Conveniently, stage 260 includes calculating a function that represents the relationship between the reference result and each of the measurement results. The function can be represented in the map.

Conveniently stage 260 includes approximating, by a low order polynomial, the relationships between the reference result the measurement results.

Conveniently, method 200 is executed in real time and its results are used to correct a lithographic process. Accordingly, stage 250 is followed by stage 280 of performing feed forward corrections of a lithographic process in response to the relative placement errors.

Conveniently, method 200 includes stage 202 of performing a global alignment process, and stage 204 performing a die alignment process. These stages precede stage 250.

Two iterations of method 250 can be applied in order to determine overlay errors. This is illustrated in FIG. 6.

FIG. 6 illustrates method 300 for determining overlay errors according to an embodiment of the invention.

Method 300 starts by stage 310 of determining a first set of relative placement errors of a first lithographic mask is that is used during a first manufacturing stage of a product. Stage 310 can include executing method 200.

Stage 310 is followed by stage 320 of determining a second set of relative placement errors of a second lithographic mask that is used during a second manufacturing stage that follows the first manufacturing stage. Stage 320 can include executing method 200.

Stage 320 is followed by stage 330 of determining expected overlay errors by comparing the first and second sets of the relative placement errors.

Stage 330 can include determining the relationships between relative gradients that are associated with different element of the lithographic mask.

Stage 330 can be followed by stage 340 of compensating for the expected overlay errors.

Figure 7:
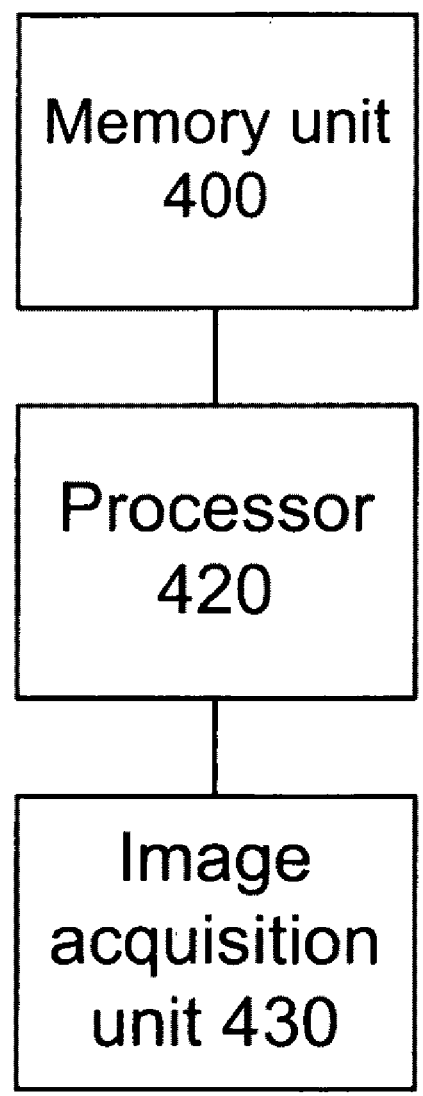
FIG. 7 illustrates a system according to an embodiment of the invention.

FIG. 7 illustrates system 400 for evaluating a placement error, the system includes memory unit 410 and processor 420. Memory unit 410 stores a reference result that represents a distance between a reference pair of points of a reference element. Processor 420 is adapted to: measure, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determine relative placement errors in response to relationships between the reference result and each of the measurement results. System 400 can include an image acquisition unit 430.

Processor 420 can apply any of the stages of method 300 or any combination of these stages.

Those skilled in the art will readily appreciate that various modifications and changes can be applied to the embodiments of the invention as hereinbefore described without departing from its scope defined in and by the appended claims.

What is claimed is:

1. A method comprising:
receiving, by a processor, a reference result that represents a distance between a reference pair of points of a reference element from a memory unit;
measuring, by the processor, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and
determining, by the processor, relative placement errors in response to relationships between the reference result and each of the measurement results.

2. The method according to claim 1 further comprising measuring, by the processor, for each pair of points out of multiple pairs of points that are associated with multiple spaced apart elements of the lithographic mask that are spread over the lithographic mask, the distance between the pair of points to provide multiple measurement results.

3. The method according to claim 1 comprising measuring, by the processor, for each pair of points out of multiple pairs of points that are associated with multiple spaced apart elements of the lithographic mask that are spread over the entire lithographic mask, the distance between the pair of points to provide multiple measurement results.

4. The method according to claim 1 further comprising generating, by the processor, a map of relative placement errors.

5. The method according to claim 1 further comprising generating, by the processor, a dense map of relative placement errors.

6. The method according to claim 1 wherein the reference result represents a distance between two ends of the reference element.

7. The method according to claim 1 wherein the reference result represents a distance between multiple repetitive sub-elements that form the reference element.

8. The method according to claim 1 wherein the reference element differs from at least one element of the lithographic mask.

9. The method according to claim 1 further comprising measuring, by the processor, a difference between a distance between a pair of points of an element and the distance between the reference pair of points of the reference element by aligning the element to the reference element.

10. The method according to claim 1 further comprising:
acquiring, by an image acquisition unit, multiple images of an array of repetitive sub elements that has a certain period;
receiving, by the processor, the acquired images from the image acquisition unit;
aligning, by the processor, different images of the array; and
determining, by the processor, at least one relative placement error in response to a sub period difference between the reference result and a measurement result.

11. The method according to claim 1 further comprising:
acquiring, by an image acquisition unit, multiple images of an array of repetitive sub elements that has a certain period;
receiving, by the processor, the acquired images from the image acquisition unit;
aligning, by the processor, different images of the array; and
applying, by the processor, a period module operation on a difference between the reference result and a measurement result.

12. The method according to claim 1 further comprising calculating, by the processor, a function that represents the relationship between the reference result and each of the measurement results.

13. The method according to claim 1 further comprising approximating, by a low order polynomial, the relationships between the reference result the measurement results, by the processor.

14. The method according to claim 1 further comprising determining, by the processor, relative placement errors in response to differences between the reference result and each of the measurement results.

15. The method according to claim 1 further comprising determining, by the processor, relative placement errors in response to differences between ratios between each measurement result and the reference result.

16. The method according to claim 1 further comprising performing, by the processor, feed forward corrections of a lithographic process in response to the relative placement errors.

17. The method according to claim 1 further comprising performing, by the processor, a global alignment process, and performing a die alignment process before determining the relative placement errors.

18. The method according to claim 1 further comprising:
determining, by the processor, a first set of relative placement errors of a first lithographic mask that is used during a first manufacturing stage of a product;
determining, by the processor, a second set of relative placement errors of a second lithographic mask that is used during a second manufacturing stage that follows the first manufacturing stage; and
determining, by the processor, expected overlay errors by comparing the first and second sets of the relative placement errors.

19. The method according to claim 18 further comprising compensating, by the processor, for the expected overlay errors.

20. The method according to claim 18 further comprising determining, by the processor, the relationships between relative gradients that are associated with different element of the lithographic mask.

21. A non-transitory computer readable medium having stored thereon computer-readable instructions, which instructions when executed by a processor cause the processor to perform operations comprising:
providing or receiving a reference result that represents a distance between a reference pair of points of a reference element;
measuring, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determining relative placement errors in response to relationships between the reference result and each of the measurement results.

22. The non-transitory computer readable medium according to claim 21 having further instructions stored thereon computer-readable instructions, which instructions when executed by a processor cause the processor to perform operations comprising, for each pair of points out of multiple pairs of points that are associated with multiple spaced apart elements of the lithographic mask that are spread over the lithographic mask, the distance between the pair of points to provide multiple measurement results.

23. The non-transitory computer readable medium according to claim 21 having further instructions stored thereon computer-readable instructions, which instructions when executed by a processor cause the processor to perform operations comprising measuring, for each pair of points out of multiple pairs of points that are associated with multiple spaced apart elements of the lithographic mask that are spread over the entire lithographic mask, the distance between the pair of points to provide multiple measurement results.

24. The non-transitory computer readable medium according to claim 21 having further instructions stored thereon computer-readable instructions, which instructions when executed by a processor cause the processor to perform operations comprising generating a map of relative placement errors.

25. The non-transitory computer readable medium according to claim 21 having further instructions stored thereon computer-readable instructions, which instructions when executed by a processor cause the processor to perform operations comprising generating a dense map of relative placement errors.

26. The non-transitory computer readable medium according to claim 21 wherein the reference result represents a distance between two ends of the reference element.

27. The non-transitory computer readable medium according to claim 21 wherein the reference result represents a distance between multiple repetitive sub-elements that form the reference element.

28. The non-transitory computer readable medium according to claim 21 wherein the reference element differs from at least one element of the lithographic mask.

29. The non-transitory computer readable medium according to claim 21 having further instructions stored thereon computer-readable instructions, which instructions when executed by a processor cause the processor to perform operations comprising measuring a difference between a distance between a pair of points of an element and the distance between the reference pair of points of the reference element by aligning the element to the reference element.

30. The non-transitory computer readable medium according to claim 21 having further instructions stored thereon computer-readable instructions, which instructions when executed by a processor cause the processor to perform operations comprising:
   acquiring multiple images of an array of repetitive sub elements that has a certain period; aligning different images of the array; and
   determining at least one relative placement error in response to a sub period difference between the reference result and a measurement result.

31. The non-transitory computer readable medium according to claim 21 having further instructions stored thereon computer-readable instructions, which instructions when executed by a processor cause the processor to perform operations comprising:
   acquiring multiple images of an array of repetitive sub elements that has a certain period; aligning different images of the array; and
   applying a period module operation on a difference between the reference result and a measurement result.

32. The non-transitory computer readable medium according to claim 21 having further instructions stored thereon computer-readable instructions, which instructions when executed by a processor cause the processor to perform operations comprising calculating a function that represents the relationship between the reference result and each of the measurement results.

33. The non-transitory computer readable medium according to claim 21 having further instructions stored thereon computer-readable instructions, which instructions when executed by a processor cause the processor to perform operations comprising approximating, by a low order polynomial, the relationships between the reference result the measurement results.

34. The non-transitory computer readable medium according to claim 21 having further instructions stored thereon computer-readable instructions, which instructions when executed by a processor cause the processor to perform operations comprising determining relative placement errors in response to differences between the reference result and each of the measurement results.

35. The non-transitory computer readable medium according to claim 21 having further instructions stored thereon computer-readable instructions, which instructions when executed by a processor cause the processor to perform operations comprising determining relative placement errors in response to differences between ratios between each measurement result and the reference result.

36. The non-transitory computer readable medium according to claim 21 having further instructions stored thereon computer-readable instructions, which instructions when executed by a processor cause the processor to perform operations comprising performing feed forward corrections of a lithographic process in response to the relative placement errors.

37. The non-transitory computer readable medium according to claim 21 having further instructions stored thereon computer-readable instructions, which instructions when executed by a processor cause the processor to perform operations comprising performing a global alignment process, and performing a die alignment process before determining the relative placement errors.

38. The non-transitory computer readable medium according to claim 21 having further instructions stored thereon computer-readable instructions, which instructions when executed by a processor cause the processor to perform operations comprising:
   determining a first set of relative placement errors of a first lithographic mask that is used during a first manufacturing stage of a product;
   determining a second set of relative placement errors of a second lithographic mask that is used during a second manufacturing stage that follows the first manufacturing stage; and
   determining expected overlay errors by comparing the first and second sets of the relative placement errors.

39. The non-transitory computer readable medium according to claim 38 having further instructions stored thereon computer-readable instructions, which instructions when executed by a processor cause the processor to perform operations comprising compensating for the expected overlay errors.

40. The non-transitory computer readable medium according to claim 38 having further instructions stored thereon computer-readable instructions, which instructions when executed by a processor cause the processor to perform operations comprising determining the relationships between relative gradients that are associated with different element of the lithographic mask.

41. A system for evaluating a placement error, the system comprises a memory unit and a processor; wherein the memory unit stores a reference result that represents a distance between a reference pair of points of a reference element; and wherein the processor is configured to: measure, for each pair of points out of multiple pairs of points that are associated with multiple spaced apart elements of the lithographic mask, the distance between the pair of points to provide multiple measurement results; wherein differences between a measurement result and the reference result are indicative of relative placement errors; and determine relative placement errors in response to relationships between the reference result and each of the measurement results.

42. The system according to claim 41 wherein the processor is configured to communicate with an optical image acquisition unit.

43. The system according to claim 41 wherein the processor is configured to measure, for each pair of points out of multiple pairs of points that are associated with multiple spaced apart elements of the lithographic mask that are spread over the lithographic mask, the distance between the pair of points to provide multiple measurement results.

44. The system according to claim 41 wherein the processor is configured to measure for each pair of points out of multiple pairs of points that are associated with multiple spaced apart elements of the lithographic mask that are spread over the entire lithographic mask, the distance between the pair of points to provide multiple measurement results.

45. The system according to claim 41 wherein the processor is configured to generate a map of relative placement errors.

46. The system according to claim 41 wherein the processor is configured to generate a dense map of relative placement errors.

47. The system according to claim 41 wherein the reference result represents a distance between two ends of the reference element.

48. The system according to claim 41 wherein the reference result represents a distance between multiple repetitive sub-elements that form the reference element.

49. The system according to claim 41 wherein the reference element differs from at least one element of the lithographic mask.

50. The system according to claim 41 wherein the processor is configured to measure a difference between a distance between a pair of points of an element and the distance between the reference pair of points of the reference element by aligning the element to the reference element.

51. The system according to claim 41 wherein the processor is configured to:

acquire multiple images of an array of repetitive sub elements that has a certain period; align different images of the array; and determine at least one relative placement error in response to a sub period difference between the reference result and a measurement result.

52. The system according to claim 41 wherein the processor is configured to:

acquire multiple images of an array of repetitive sub elements that has a certain period; align different images of the array; and apply a period module operation on a difference between the reference result and a measurement result.

53. The system according to claim 41 wherein the processor is configured to calculate a function that represents the relationship between the reference result and each of the measurement results.

54. The system according to claim 41 wherein the processor is configured to approximate by a low order polynomial, the relationships between the reference result the measurement results.

55. The system according to claim 41 wherein the processor is configured to determine relative placement errors in response to differences between the reference result and each of the measurement results.

56. The system according to claim 41 wherein the processor is configured to determine relative placement errors in response to differences between ratios between each measurement result and the reference result.

57. The system according to claim 41 wherein the processor is configured to perform feed forward corrections of a lithographic process in response to the relative placement errors.

58. The system according to claim 41 wherein the processor is configured to perform a global alignment process, and perform a die alignment process before determining the relative placement errors.

59. The system according to claim 41 wherein the processor is configured to:

determine a first set of relative placement errors of a first lithographic mask that is used during a first manufacturing stage of a product;

determine a second set of relative placement errors of a second lithographic mask that is used during a second manufacturing stage that follows the first manufacturing stage; and determine expected overlay errors by comparing the first and second sets of the relative placement errors.

60. The system according to claim 59 wherein the processor is configured to compensate for the expected overlay errors.

61. The system according to claim 59 wherein the processor is configured to determine the relationships between relative gradients associated with different element of the lithographic mask.

* * * * *